(12) United States Patent
Soumyanath

(10) Patent No.: US 6,268,774 B1
(45) Date of Patent: Jul. 31, 2001

(54) SELF-TUNING AMPLIFIER

(75) Inventor: Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/434,250

(22) Filed: Nov. 5, 1999

(51) Int. Cl.⁷ ...................................................... H03F 3/04
(52) U.S. Cl. ............................................ 330/305; 330/296
(58) Field of Search .................................. 330/296, 305, 330/311

(56) References Cited

U.S. PATENT DOCUMENTS

| | | | |
|---|---|---|---|
| 4,179,668 | * 12/1979 | Schuermann | 330/277 |
| 4,504,908 | * 3/1985 | Riederer et al. | 364/414 |
| 4,783,849 | 11/1988 | Muterspaugh | 455/197 |
| 4,921,465 | 5/1990 | Hietala et al. | 455/193 |
| 5,122,915 | 6/1992 | Klein et al. | 360/113 |
| 5,274,339 | 12/1993 | Wideman et al. | 330/54 |
| 5,493,715 | 2/1996 | Humphreys et al. | 455/264 |
| 5,564,098 | 10/1996 | Rodal et al. | 455/314 |
| 5,574,993 | 11/1996 | Kobayashi et al. | 455/126 |
| 5,600,187 | 2/1997 | El-Hamamsy et al. | 307/157 |
| 5,729,171 | 3/1998 | Straw et al. | 327/581 |
| 5,764,101 | * 6/1998 | Archer | 330/253 |
| 5,825,206 | * 10/1998 | Krishnamurthy et al. | 326/81 |
| 5,838,388 | 11/1998 | Blanc | 348/589 |
| 5,847,581 | 12/1998 | Allen | 326/81 |
| 5,929,707 | 7/1999 | Samuels | 330/283 |
| 5,939,940 | 8/1999 | Patti | 330/149 |
| 5,939,942 | 8/1999 | Greason et al. | 330/253 |
| 5,999,043 | * 10/1998 | Zhang et al. | 327/558 |
| 6,140,877 | * 10/2000 | Forbes | 330/258 |

* cited by examiner

Primary Examiner—Robert Pascal
Assistant Examiner—Henry Choe
(74) Attorney, Agent, or Firm—Schwegman, Lundberg, Woessner & Kluth, P.A.

(57) ABSTRACT

A signal processing apparatus includes an amplifier for processing an input signal and a variable voltage source. The variable voltage source is coupled to the amplifier substrate, and the input impedance of the amplifier is controlled by varying the voltage on the substrate body of the amplifier. In processing a radio frequency (RF) signal, the amplifier receives the RF signal, and by varying the voltage on the amplifier substrate, the input impedance of the amplifier is matched to the source impedance. The overall noise performance of the amplifier is improved by employing an automatic gain control system and a digital-to-analog converter in a feedback loop between the output port of the amplifier and the amplifier substrate.

26 Claims, 5 Drawing Sheets

SELF-TUNING AMPLIFIER

FIELD

This invention relates to amplifiers, and more particularly to self-tuning amplifiers.

BACKGROUND

A low noise amplifier is often used to initially amplify low level signals, such as radio frequency signals used in communication systems. Desirable properties in a low noise amplifier include a low noise figure and a high gain. FIG. 1 is a schematic diagram of one embodiment of prior art low noise amplifier 100. Low noise amplifier 100 includes transistors 103 and 106, inductors 109 and 112, and impedance matching network 115. Signal source 118 is coupled to impedance matching network 115. The output signal from impedance matching network 115 is coupled to transistor 103. Transistor 103 is connected in series with transistor 106 and inductors 109 and 112. Inductor 109 functions as a direct current bias conduit and radio frequency load while assisting in tuning out the input capacitance of the following stage. Inductor 112 is capable of tuning the input impedance of transistor 103 to match the signal source impedance while degenerating the source to improve the linearity of the amplifier.

Tuning affects the noise figure, gain, and stability of a low noise amplifier, so tuning is an important feature of the input stage of a low noise amplifier. Inductor 112 alone is not sufficient to provide precise tuning for low noise amplifier 100, since the value of the parasitics that inductor 112 is attempting to tune are typically not known and are difficult to characterize experimentally. A value for inductor 112 is chosen to provide "coarse" tuning of the input impedance. Impedance matching network 115 is added to provide "fine" tuning. Unfortunately, impedance matching network 115 requires the use of expensive off-chip components. Since the inductor values capable of being realized in complementary metal-oxide semiconductor (CMOS) process are poorly controlled and restricted to a very narrow range, the use of off-chip components is common in the fabrication of low noise amplifiers using CMOS processes. Therefore, inductor 112 cannot be used alone to precisely tune low noise amplifier 100 to the source impedance.

For these an other reasons there is a need for the present invention.

SUMMARY

An apparatus includes an amplifier and a voltage source. The amplifier has an input impedance and a substrate body. The voltage source is coupled to the substrate body and is operable for controlling the input impedance.

DESCRIPTION

Figure 1:
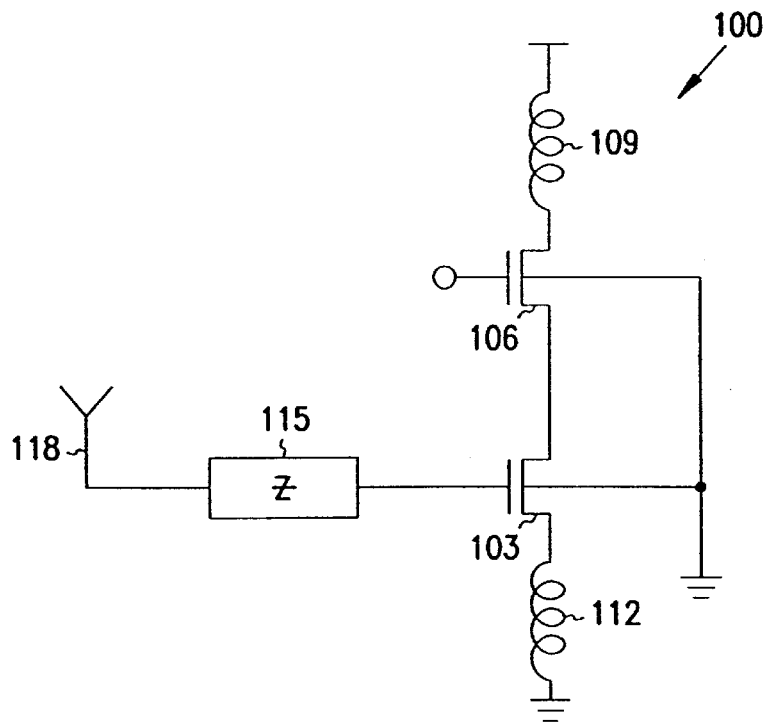
FIG. 1 is schematic diagram of a prior art low noise amplifier.
Figure 2:
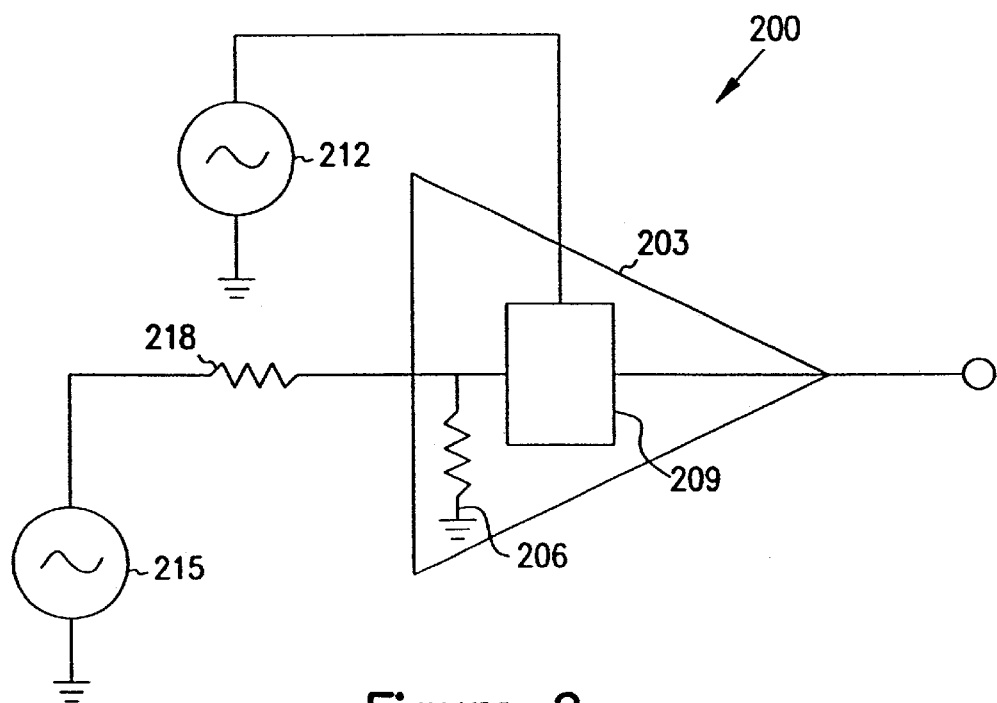
FIG. 2 is a block diagram of one embodiment of a low noise amplifier of the present invention.

FIG. 2 is a block diagram of one embodiment of signal processing apparatus 200. Signal processing apparatus 200 includes amplifier 203, input impedance 206, substrate body 209, and variable voltage source 212. In operation, signal processing apparatus 200 processes a low level signal provided by signal source 215 having source impedance 218.

Amplifier 203 is coupled to signal source 215 through source impedance 218. Variable voltage source 212 is coupled to substrate body 209. In operation, input impedance 206 of amplifier 203 is controlled by varying the voltage on substrate body 209 through variable voltage source 212. Varying the voltage on substrate body 209 varies the capacitance of the source substrate junction of amplifier 203. The ability to vary the capacitance of the source substrate junction of amplifier 203 provides signal processing apparatus 200 with the capability to match input impedance 206 of amplifier 203 to source impedance 218. And this ability provides for a low noise amplifier 203 that is useful in a wide range of signal processing applications.

Signal source 215 generates a low level signal between about $10^{-3}$ and $10^{-6}$ volts. Alternatively, signal source 215 generates a low level signal between about $10^{-3}$ and $10^{-7}$ amperes. Sources of low level signals include radio transmitters, magnetic recording media, lasers, and light emitting diodes. The signals produced by these sources are converted to volts and amperes through transducers, such as antennas, magneto-resistive heads, charge-coupled devices, and photo-diodes. In FIG. 2, these transducers, are modeled by signal source 215 in combination with source impedance 218, which may vary from a few ohms up to several megohms. A low level signal generated by signal source 215 generally includes noise. Occasionally, the noise spectrum of the low level signal is outside the frequency spectrum of the information contained in the signal, but more often the noise spectrum contains frequency components that are indistinguishable from the information spectrum of the signal. In processing the low level signal provided by signal source 215, amplifier 203 should introduce as little noise as possible into the signal. This is accomplished by selecting an amplifier 203 that has a low noise figure and matching input impedance 206 to source impedance 218.

Amplifier 203, for one embodiment, includes a front end complementary metal-oxide semiconductor (CMOS) field-effect transistor fabricated on substrate body 209. In a preferred embodiment, substrate body 209 is a p-type semiconductor. Alternatively, substrate body 209 is an n-type semiconductor. Amplifier 203 is coupled to signal source 215 through source impedance 218. The CMOS field-effect transistor has an input impedance. For one embodiment, the input impedance of the CMOS field-effect transistor is varied by varying the voltage applied to substrate body 209 by variable voltage source 212.

Figure 3:
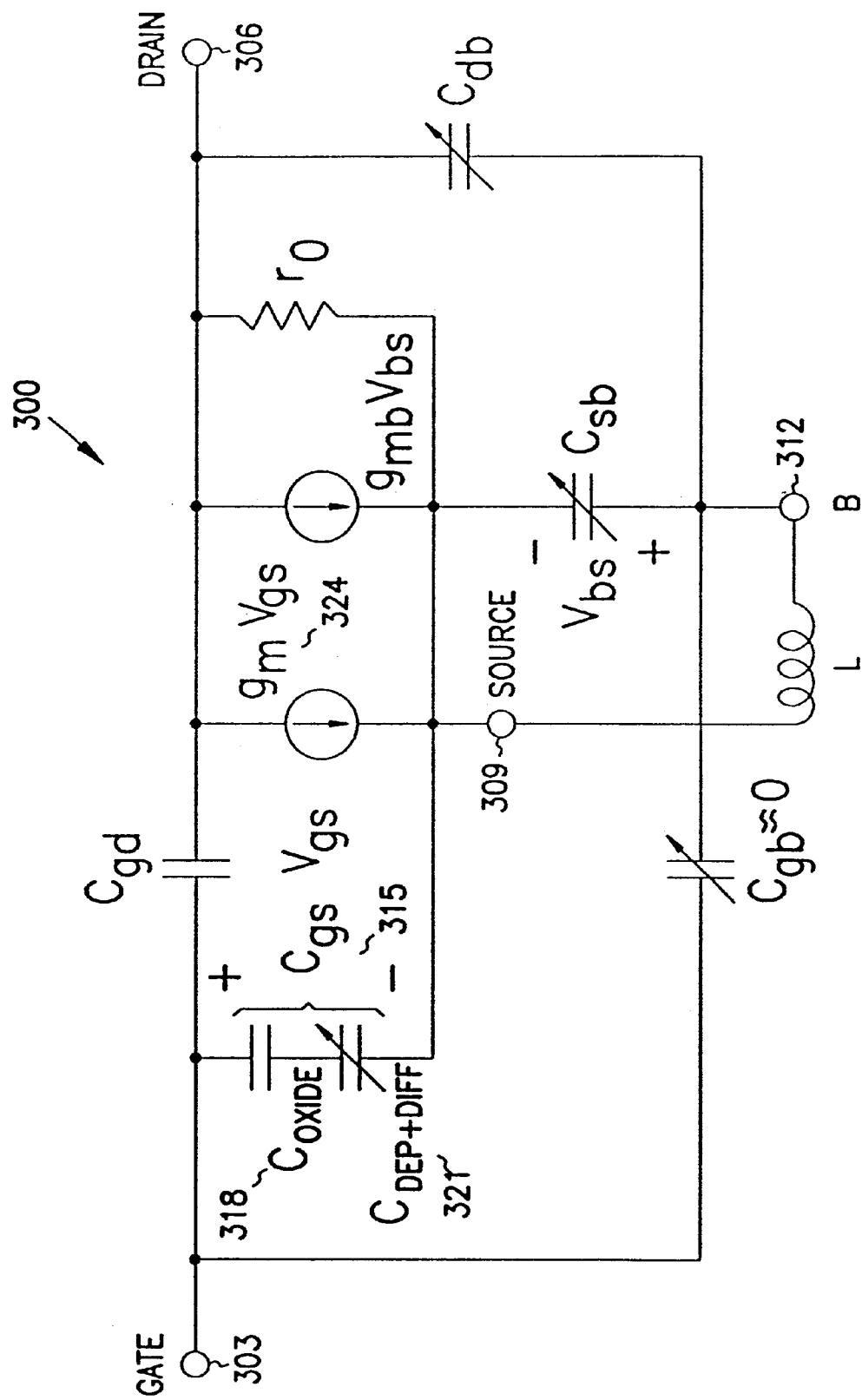
FIG. 3 is a schematic diagram of a small-signal model of a metal-oxide-semiconductor field-effect (MOSFET) transistor.

FIG. 3 shows a schematic diagram of a small signal model 300 for a CMOS field effect transistor including gate 303, drain 306, source 309, and substrate 312 connections. In small signal model 300, the gate-to-source capacitance $C_{gs}$ 315 includes the channel portion of the oxide capacitor. The oxide capacitance consists of two series connected components, a fixed part $C_{oxide}$ 318 and a voltage variable part $C_{depletion+diffusion}$ 321. $C_{oxide}$ 318 is the capacitance formed between the CMOS gate and substrate, and the $C_{depletion+diffusion}$ 321 capacitance is a voltage variable capacitance formed by the depletion and diffusion regions of the diode junction between the source substrate body of a CMOS transistor. In addition, there is the gate-to-drain capacitance $C_{gd}$ and the gate-to-bulk capacitance $C_{gb}$. $C_{gb}$ is approximately equal to zero when the device is appropriately biased and the small signal model is applicable. The input impedance of small signal model 300 is $Z_{in}=(sL+(1/sC_{gs})+g_m(L/C_{gs}))$ without a voltage applied to substrate 312. With a voltage applied to substrate 312, the input impedance $Z_{in}$ is a function of the voltage applied to substrate 312, since $C_{gs}$ 315 and transconductance $g_m$ 324 are both a function of the voltage applied to substrate 312. The input impedance is also modulated by $C_{sb}$, which is the source to bulk capacitance, which also varies with the voltage applied to the substrate 312.

Figure 4:
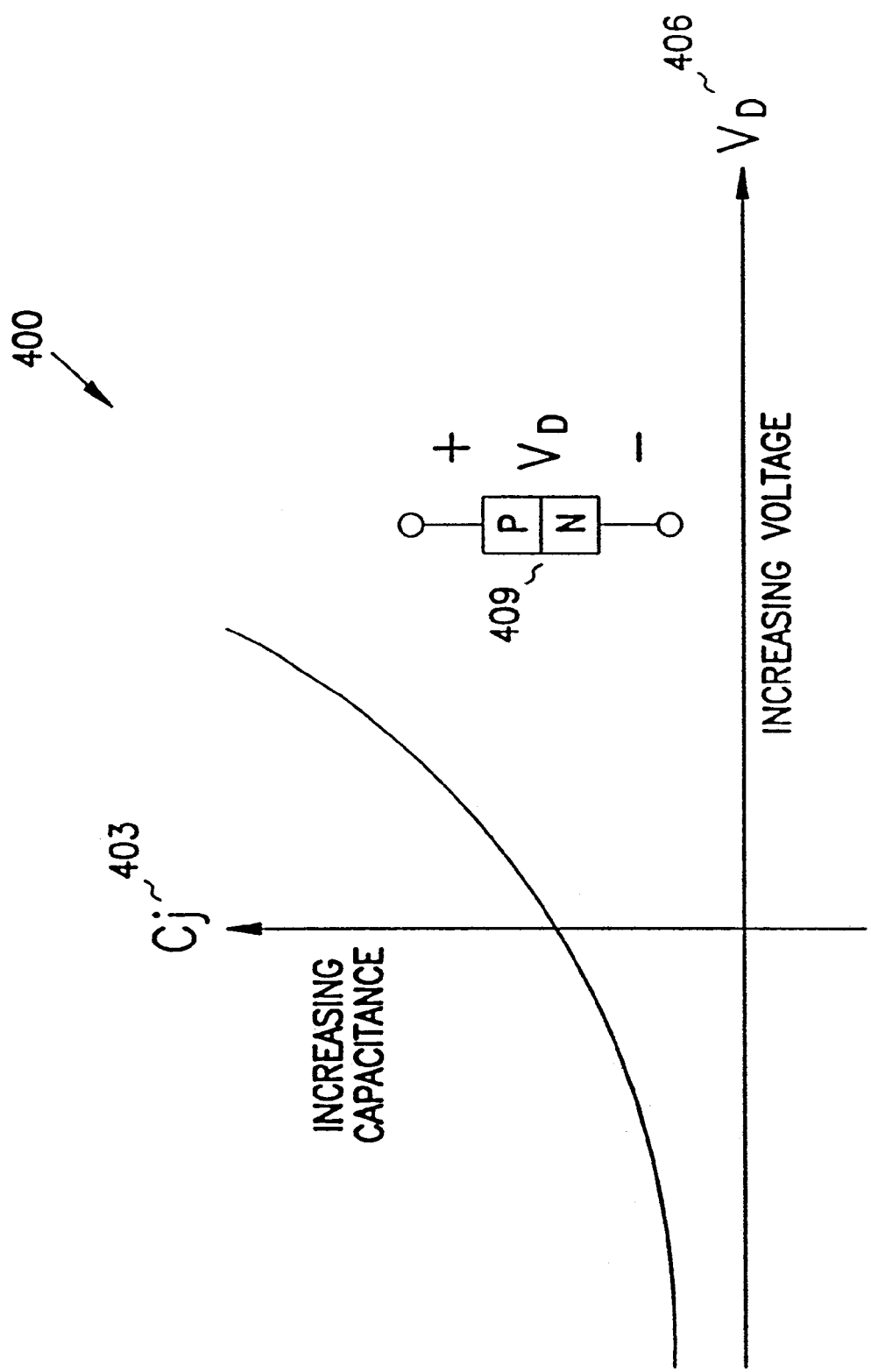
FIG. 4 is a graph of diode junction capacitance versus voltage.

FIG. 4 shows a graph 400 of junction capacitance $C_j$ 403 versus voltage $V_D$ 406 across a PN junction 409. Junction capacitance $C_j$ 403 varies with voltage and can therefore be controlled by varying the voltage $V_D$ 406. For a reverse biased junction, the holes in the p-region are attracted to the anode terminal and electrons in the n-region are attracted to the cathode terminal creating a depletion region where there is little current. The depletion region is essentially devoid of carriers and behaves as the dielectric of a capacitor. The depletion region increases as the reverse voltage across it increases; and since capacitance varies inversely with dielectric thickness, the junction capacitance decreases as the voltage across PN junction 409 increases. So, by varying the reverse voltage across a PN junction the junction capacitance is varied. When forward biased, as long as the forward current is small, PN junction 409 continues to function as a voltage controlled capacitor and the relationship between the junction capacitance $C_j$ 504 and voltage $V_D$ 406 across the junction is as shown in FIG. 4. This mechanism is responsible for the voltage variability of $C_{gs}$ and $C_{sb}$.

Figure 5:
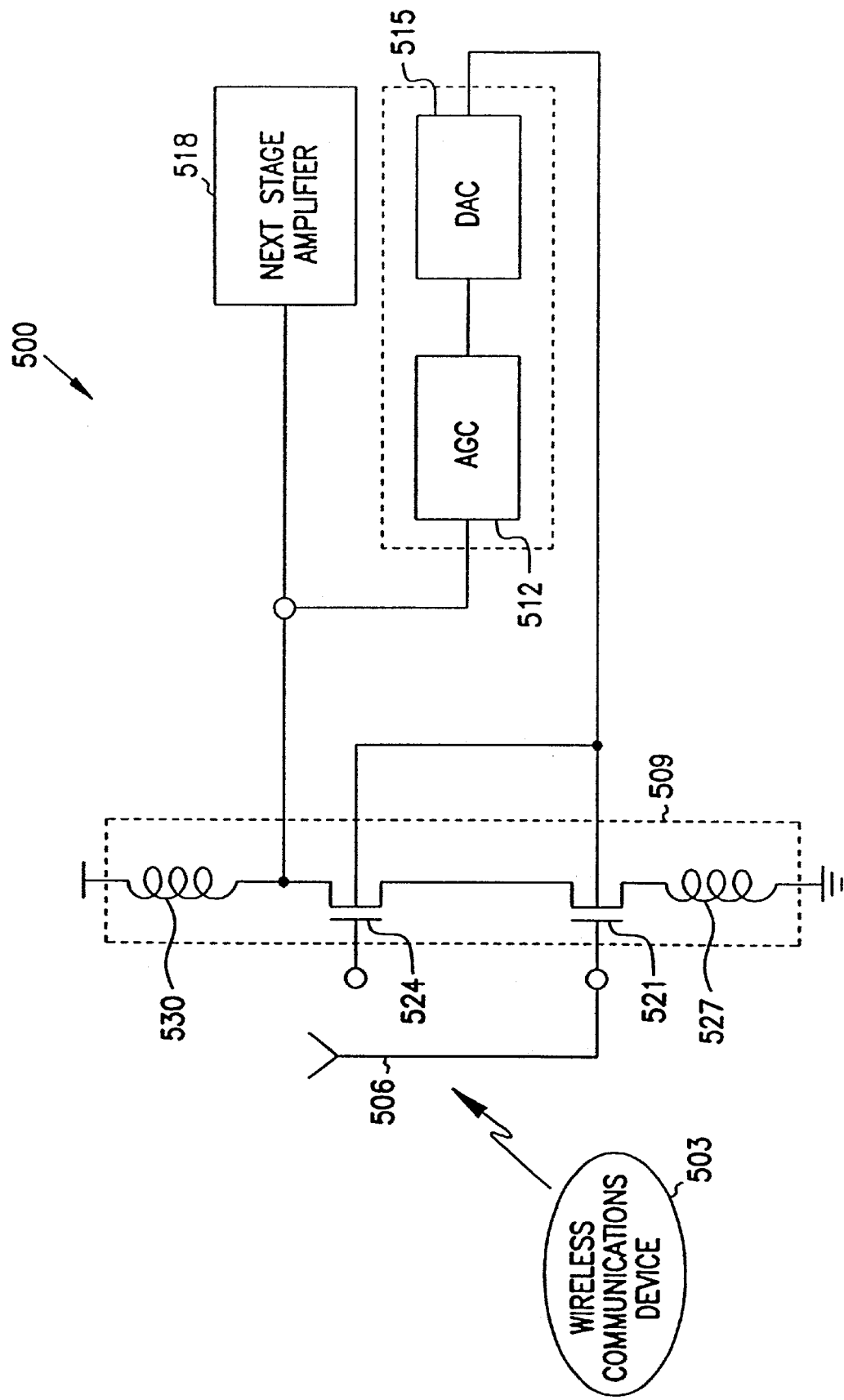
FIG. 5 is a block diagram of one embodiment of a low noise amplifier used in conjunction with a wireless communication system.

FIG. 5 is a block diagram of one embodiment of a low noise amplifier used in conjunction with a wireless communication system 500. Wireless communication system 500 includes communication device 503, antenna 506, cascode amplifier 509, automatic gain control 512, digital-to-analog-converter (DAC) 515, and next stage amplifier 518. The input port of cascode amplifier 509 is coupled to the output port of antenna 506, and the output port of cascode amplifier 509 is coupled to an input port of next stage amplifier 518 and an input port of automatic gain control (AGC) 512. An output port of AGC 512 is coupled to an input port of DAC 515 and an output port of DAC 515 is coupled to the substrate body of cascode amplifier 518.

Communication device 503, for one embodiment, is a portable transmitter, such as a cell phone. Alternatively, communication device 503 is a satellite based transmitter or a fixed transmitter, such as a radio or television transmitter. The output of communication device 503 is received by antenna 506. Any device capable of receiving electromagnetic energy and transforming the electromagnetic energy into an electronic signal is suitable for use as antenna 506. For one embodiment, antenna 506 is a dipole antenna. Alternatively, antenna 506 is a loop antenna. In still another alternate embodiment, antenna 506 is a microwave antenna. The electronic signal generated by antenna 506 is amplified by cascode amplifier 509. Cascode amplifier 509, for one embodiment, includes serially connected MOSFETS 521 and 524 connected in series with inductors 527 and 530. For one embodiment, inductors 527 and 530 are spiral inductors. The amplified signal generated by cascode amplifier 509 is processed by AGC 512 in combination with DAC 515. For one embodiment, DAC 515 is a sixteen-bit digital-to-analog converter. For an alternate embodiment, DAC 515 is an eight-bit digital-to-analog converter. DAC 515 provides a feedback signal to the substrate of cascode amplifier 509 to vary the input impedance of cascode amplifier 509. For one embodiment, AGC 512 and DAC 515 are fabricated on a single chip. Alternatively, AGC 512 and DAC 515 are fabricated separately and assembled in a multi-chip module. For another alternate embodiment, AGC 512 is implemented in a general purpose microprocessor. Alternatively, AGC 512 is implemented in a digital signal processing (DSP) processor.

In operation, communication device 503 emits an electromagnetic signal that is received by antenna 506. Antenna 506 converts the received electromagnetic signal to an electronic signal which is coupled to cascode amplifier 509. Cascode amplifier 509 amplifies the electronic signal and provides the amplified electronic signal to AGC 512. AGC 512 processes the amplified electronic signal and provides the processed signal to DAC 515. DAC 515 is coupled to the substrate body of cascode amplifier 509 and drives the input impedance of cascode amplifier 509 to match the output impedance of antenna 506. The response of the input impedance of cascode amplifier 509 with respect to the voltage applied to the substrate body is described above with reference to FIG. 3. By matching the input impedance of cascode amplifier 509 to the output impedance of antenna 506 the process of amplifying the electronic signal adds very little noise to the electronic signal generated in antenna 118.

Figure 6:
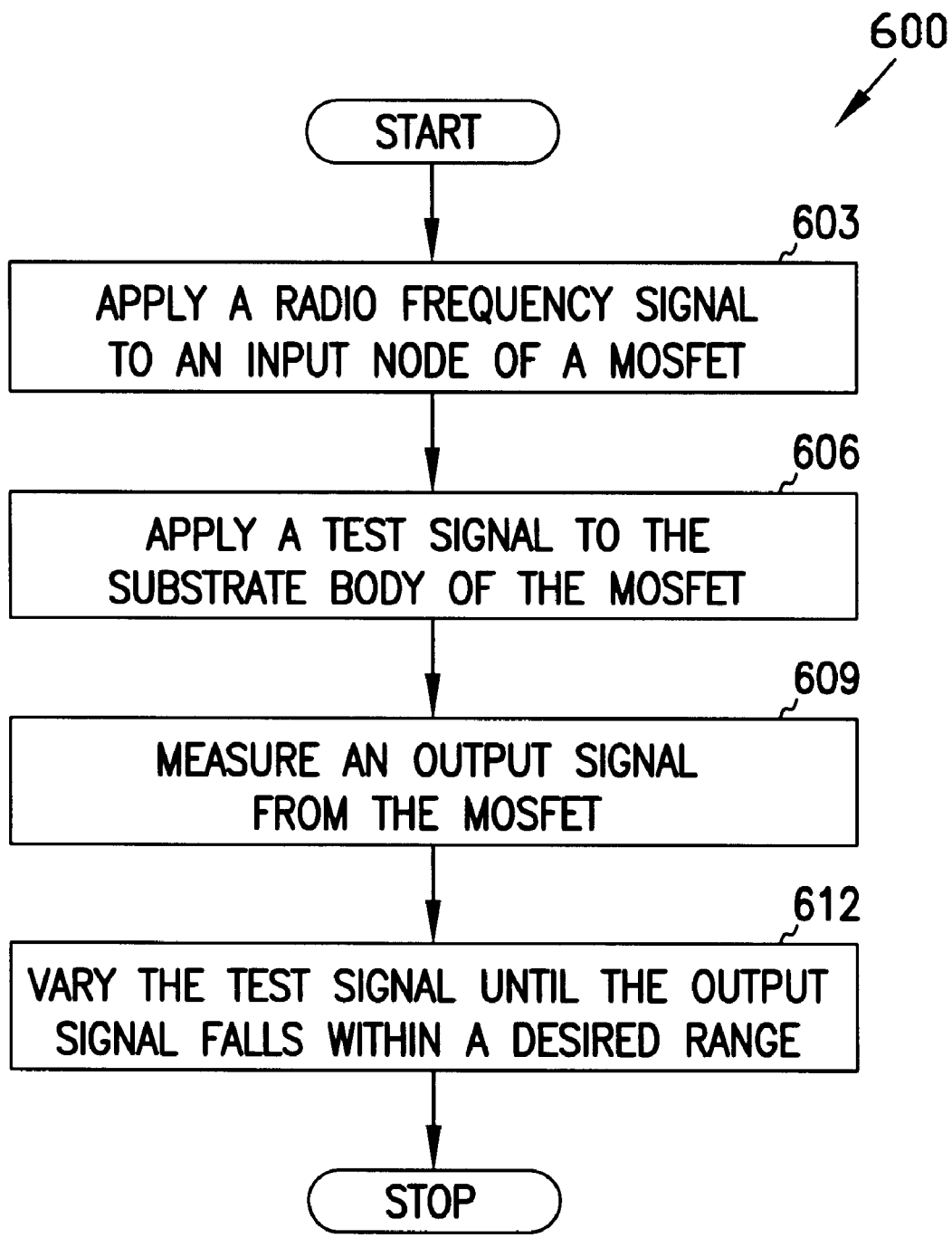
FIG. 6 is a flow diagram of a method for testing a low noise amplifier.

FIG. 6 is a flow diagram of a testing method 600 for low noise amplifiers. Low noise amplifiers are often held to very tight specifications. Due to variations inherent in the integrated circuit manufacturing processes, some number of low noise amplifiers, when tested, will fail to meet the tight specifications. Testing of low noise amplifiers is therefore an important part of the manufacturing process. For one embodiment of the present invention, the testing of low noise amplifiers is accomplished using only the standard signal ports provided in the design of the low noise amplifier. No additional test ports or test points need to be included in the design of the low noise amplifier. For example, for a low noise amplifier designed to amplify radio frequency signals, a radio frequency test signal is applied to an input node of the MOSFET under test (block 603.) This test signal is amplified by the low noise amplifier and the amplified version of the test signal is available at the output port of the low noise amplifier. A second test signal, sometimes referred to as a gain control signal, is also applied to the substrate body of the MOSFET (block 606.) This second test signal controls the gain of the low noise amplifier by controlling the input impedance to the amplifier. After applying the radio frequency test signal and the gain control signal, the output signal from the MOSFET is measured (block 609.) If the value of the output signal is within the specification, the test is complete. If the value of the output signal is not within the specification, the test signal is varied until the value of the output signal falls with a desired range (block 612.) If varying the gain control signal fails to result in the output signal entering the desired range, the low noise amplifier fails the test.

Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. Apparatus comprising:
   an amplifier having an input impedance and a substrate body; and
   a variable voltage source coupled to the substrate body, the variable voltage source is operable for controlling the input impedence.

2. The apparatus of claim 1, wherein the amplifier is a low-noise amplifier.

3. The apparatus of claim 2, wherein the low-noise amplifier is fabricated using a complementary metal-oxide semiconductor process.

4. The apparatus of claim 3, wherein the substrate body is an p-type semiconductor.

5. Apparatus comprising:
   a signal source having a signal and a signal source impedance;
   an amplifier operable for receiving the signal, the amplifier having an input impedance and a substrate body; and
   a variable voltage source coupled to the substrate body, the variable voltage source is operable for varying a voltage on the substrate body in order to control the input impedance.

6. The apparatus of claim 5, wherein the amplifier has a gain and the variable voltage source is operable for varying the gain.

7. The apparatus of claim 5, wherein the variable voltage source is a digital-to-analog converter.

8. The apparatus of claim 5, further comprising:
   an automatic gain control unit coupled to the amplifier and the variable voltage source.

9. The apparatus of claim 8, wherein the signal source impedance comprises an antenna impedance.

10. Apparatus for processing a signal having a signal source impedance, the apparatus comprising:
    a metal-oxide semiconductor field-effect transistor (MOSFET) operable for receiving the signal, the MOSFET having, an input impedance and a substrate body; and
    a variable voltage source coupled to the substrate body, the variable voltage source is operable for varying the input impedence to match the signal source impedance.

11. The apparatus of claim 10, wherein the substrate body comprises an p-type semiconductor.

12. The apparatus of claim 10, wherein the variable voltage source comprises a sixteen bit digital-to-analog converter.

13. The apparatus of claim 12, further comprising:
    an automatic gain control coupled to the sixteen bit digital-to-analog converter and an output of the MOSFET.

14. Apparatus for processing a signal having a signal source impedance, the apparatus comprising:
    a cascode amplifier operable for receiving the signal, the cascode amplifier having an input impedance, a gain, and a substrate body; and
    a variable voltage source coupled to the substrate body, the variable voltage source operable for varying a voltage on the substrate body in order to control the gain of the cascode amplifier.

15. The apparatus of claim 14, further comprising:
    a plurality of inductors in series with the cascode amplifier.

16. The apparatus of claim 15, wherein each of the plurality of inductors is a spiral inductor.

17. A communication system comprising:
    an antenna having a source impedence;
    an amplifier having a field-effect transistor (FET) input stage coupled to the antenna, the FET input stage having an input impedance and a substrate body; and
    a variable voltage source coupled to the substrate body, the variable voltage source is operable for varying the input impedance.

18. The communication system of claim 17, wherein the antenna is capable of receiving radio frequency signals.

19. The communication system of claim 17, wherein the antenna is capable of receiving microwave signals.

20. The communication system of claim 17, wherein the antenna is capable of receiving ultra low frequency signals.

21. The communication system of claim 17, wherein the variable voltage source comprises:
    a digital-to-analog converter; and
    an automatic gain control coupled to the digital-to-analog converter and to an output of the amplifier.

22. A computing system comprising:
    an antenna having a source impedence;
    an amplifier having a MOSFET input stage coupled to the antenna, the MOSFET input stage having an input impedance and a substrate body;
    a variable voltage source coupled to the substrate body, the variable voltage source operable for varying the input impedance to match the source impedence; and
    a processor including a DAC coupled to the amplifier.

23. The computing system of claim 22, wherein the amplifier, the variable voltage source and the processor are fabricated on a common substrate.

24. The computing system of claim 23, wherein the common substrate is a p-type semiconductor.

25. A method comprising:
    applying an radio signal to an input node of a metal-oxide field-effect transistor (MOSFET) amplifier;
    applying a test signal to a substrate body of the MOSFET amplifier;
    measuring an output signal at an output node of the MOSFET amplifier; and
    varying the test signal until the output signal falls within a desired range.

26. A method comprising:
    receiving a radio frequency signal at an amplifier having a substrate and an input impedance, the radio frequency signal having a source impedance; and
    varying a voltage on the substrate to match the input impedance to the source impedance.

* * * * *

UNITED STATES PATENT AND TRADEMARK OFFICE
CERTIFICATE OF CORRECTION

PATENT NO.     : 6,268,774 B1
DATED          : July 31, 2001
INVENTOR(S)    : Soumyanath It is certified that error appears in the above-identified patent and that said Letters Patent is hereby corrected as shown below:

<u>Column 1,</u>
Line 45, delete "an" and insert -- and --, therefor.

Signed and Sealed this

Sixteenth Day of April, 2002

Attest:

JAMES E. ROGAN
*Director of the United States Patent and Trademark Office*

*Attesting Officer*